(12) United States Patent
Babayan et al.

(10) Patent No.: US 8,936,709 B2
(45) Date of Patent: Jan. 20, 2015

(54) ADAPTABLE FREE-STANDING METALLIC ARTICLE FOR SEMICONDUCTORS

(71) Applicant: GTAT Corporation, Nashua, NH (US)

(72) Inventors: Steve Babayan, Los Altos, CA (US);
Robert Brainard, Sunnyvale, CA (US);
Arvind Chari, Saratoga, CA (US);
Alejandro de la Fuente Vornbrock, San Carlos, CA (US); Venkatesan Murali, San Jose, CA (US); Gopal Prabhu, San Jose, CA (US); Arthur Rudin, Morgan Hill, CA (US); Venkateswaran Subbaraman, San Jose, CA (US); David Tanner, San Jose, CA (US); Dong Xu, Fremont, CA (US)

(73) Assignee: GTAT Corporation, Merrimack, NH (US)

( * ) Notice: Subject to any disclaimer, the term of this patent is extended or adjusted under 35 U.S.C. 154(b) by 0 days.

(21) Appl. No.: 14/079,540

(22) Filed: Nov. 13, 2013

(65) Prior Publication Data
US 2014/0262793 A1    Sep. 18, 2014

Related U.S. Application Data

(63) Continuation-in-part of application No. 13/798,123, filed on Mar. 13, 2013.

(51) Int. Cl.
*C25D 1/00* (2006.01)
*C25D 1/04* (2006.01)
*C25D 1/08* (2006.01)

(52) U.S. Cl.
CPC ... *C25D 1/04* (2013.01); *C25D 1/08* (2013.01)
USPC ................ 205/78; 205/67; 205/122

(58) Field of Classification Search
CPC ............. C25D 1/08; C25D 1/04; H01L 31/08
USPC .................... 205/76, 70, 78, 77, 122
See application file for complete search history.

(56) References Cited

U.S. PATENT DOCUMENTS

| RE25,647 E | 9/1964 | Mann et al. |
| 3,442,007 A | 5/1969 | Griffin et al. |

(Continued)

FOREIGN PATENT DOCUMENTS

| JP | 2012204660 A | 10/2012 |
| KR | 20080050862 A | 6/2008 |

(Continued)

OTHER PUBLICATIONS

Day4 Energy, "Day4 stay-powerful Technology", YouTube, Web, Uploaded May 6, 2011, www.youtube.com/watch?v=k8RgNwtApF0&feature=youtu.be.

(Continued)

*Primary Examiner* — Luan Van
*Assistant Examiner* — Louis Rufo
(74) *Attorney, Agent, or Firm* — The Mueller Law Office, P.C.

(57) ABSTRACT

A free-standing metallic article, and method of making, is disclosed in which the metallic article is electroformed on an electrically conductive mandrel. The metallic article has a plurality of electroformed elements that are configured to serve as an electrical conduit for a photovoltaic cell. A first electroformed element has at least one of: a) a non-uniform width along a first length of the first element, b) a change in conduit direction along the first length of the first element, c) an expansion segment along the first length of the first element, d) a first width that is different from a second width of a second element in the plurality of electroformed elements, e) a first height that is different from a second height of the second element in the plurality of electroformed elements, and f) a top surface that is textured.

29 Claims, 12 Drawing Sheets

(56) References Cited

U.S. PATENT DOCUMENTS

| | | | |
|---|---|---|---|
| 3,483,038 | A | 12/1969 | Hui et al. |
| 4,336,648 | A | 6/1982 | Pschunder et al. |
| 4,380,112 | A | 4/1983 | Little |
| 4,443,652 | A | 4/1984 | Izu et al. |
| 4,542,255 | A | 9/1985 | Tanner et al. |
| 4,574,160 | A | 3/1986 | Cull et al. |
| 4,590,327 | A | 5/1986 | Nath et al. |
| 4,652,693 | A * | 3/1987 | Bar-On .......... 136/251 |
| 4,695,674 | A | 9/1987 | Bar-on |
| 4,871,623 | A | 10/1989 | Hoopman et al. |
| 4,915,743 | A | 4/1990 | Schilling |
| 5,011,565 | A | 4/1991 | Dube et al. |
| 5,045,481 | A | 9/1991 | Schilling et al. |
| 5,100,808 | A | 3/1992 | Glenn |
| 5,178,685 | A | 1/1993 | Borenstein et al. |
| 5,236,572 | A | 8/1993 | Lam et al. |
| 5,542,988 | A | 8/1996 | Bogus |
| 5,620,528 | A | 4/1997 | Schade et al. |
| 5,620,904 | A | 4/1997 | Hanoka |
| 5,661,041 | A | 8/1997 | Kano |
| 5,759,291 | A | 6/1998 | Ichinose et al. |
| 6,150,602 | A | 11/2000 | Campbell |
| 6,235,984 | B1 | 5/2001 | Wambach et al. |
| RE37,512 | E | 1/2002 | Szlufcik et al. |
| 6,359,209 | B1 | 3/2002 | Glenn et al. |
| 6,448,492 | B1 | 9/2002 | Okada et al. |
| 6,547,944 | B2 | 4/2003 | Schreiber et al. |
| 7,022,910 | B2 | 4/2006 | Gaudiana et al. |
| 7,097,754 | B2 | 8/2006 | Warlimont |
| 7,390,961 | B2 | 6/2008 | Aschenbrenner et al. |
| 7,432,438 | B2 | 10/2008 | Rubin et al. |
| 7,531,120 | B2 | 5/2009 | Van Rijn et al. |
| 7,635,810 | B2 | 12/2009 | Luch |
| 7,704,352 | B2 | 4/2010 | Lopatin et al. |
| 7,732,243 | B2 | 6/2010 | Luch |
| 7,749,883 | B2 | 7/2010 | Meeus et al. |
| 7,781,672 | B2 | 8/2010 | Gaudiana et al. |
| 7,799,182 | B2 | 9/2010 | Lopatin et al. |
| 7,804,022 | B2 | 9/2010 | De Ceuster |
| 7,851,700 | B2 | 12/2010 | Luch |
| 7,852,543 | B2 | 12/2010 | Goetz et al. |
| 7,868,249 | B2 | 1/2011 | Luch |
| 7,955,123 | B2 | 6/2011 | Wirth |
| 7,989,692 | B2 | 8/2011 | Luch |
| 8,013,239 | B2 | 9/2011 | Rubin et al. |
| 8,066,840 | B2 | 11/2011 | Narasimhan et al. |
| 8,076,568 | B2 | 12/2011 | Luch et al. |
| 8,110,737 | B2 | 2/2012 | Luch |
| 8,120,132 | B2 | 2/2012 | Guha et al. |
| 8,138,413 | B2 | 3/2012 | Luch et al. |
| 8,148,627 | B2 | 4/2012 | Rose et al. |
| 8,163,332 | B2 | 4/2012 | Emoto et al. |
| 8,222,513 | B2 | 7/2012 | Luch |
| 8,319,097 | B2 | 11/2012 | Luch |
| 8,569,096 | B1 | 10/2013 | Babayan et al. |
| 8,629,061 | B2 | 1/2014 | Murali et al. |
| 8,691,620 | B2 | 4/2014 | Lee et al. |
| 8,697,980 | B2 | 4/2014 | Paulson et al. |
| 8,704,086 | B2 | 4/2014 | Fork et al. |
| 8,729,385 | B2 | 5/2014 | Luch |
| 2004/0115536 | A1 * | 6/2004 | Blankenborg et al. ........ 429/245 |
| 2004/0187911 | A1 | 9/2004 | Gaudiana et al. |
| 2005/0022857 | A1 | 2/2005 | Daroczi et al. |
| 2008/0083453 | A1 | 4/2008 | Rose et al. |
| 2008/0102558 | A1 | 5/2008 | Fork et al. |
| 2008/0216887 | A1 | 9/2008 | Hacke et al. |
| 2009/0081823 | A1 | 3/2009 | Meeus et al. |
| 2010/0000602 | A1 | 1/2010 | Gray et al. |
| 2010/0012172 | A1 | 1/2010 | Meakin et al. |
| 2010/0021695 | A1 | 1/2010 | Naoyuki et al. |
| 2010/0031999 | A1 | 2/2010 | Mishima et al. |
| 2010/0071765 | A1 | 3/2010 | Cousins et al. |
| 2010/0096569 | A1 | 4/2010 | Nguyen et al. |
| 2010/0243024 | A1 * | 9/2010 | Hashimoto et al. ........... 136/244 |
| 2010/0275976 | A1 | 11/2010 | Rubin et al. |
| 2010/0291385 | A1 | 11/2010 | Greer et al. |
| 2010/0319754 | A1 | 12/2010 | Sajjad et al. |
| 2010/0319761 | A1 | 12/2010 | Fork et al. |
| 2011/0162701 | A1 | 7/2011 | Truzzi et al. |
| 2011/0174354 | A1 | 7/2011 | Kutzer et al. |
| 2011/0203654 | A1 | 8/2011 | Kihara et al. |
| 2011/0247859 | A1 | 10/2011 | Zagdoun et al. |
| 2011/0273085 | A1 | 11/2011 | Garbar et al. |
| 2011/0315217 | A1 * | 12/2011 | Gee .............................. 136/256 |
| 2012/0125434 | A1 | 5/2012 | Doi |
| 2012/0132273 | A1 | 5/2012 | Lee et al. |
| 2012/0180850 | A1 | 7/2012 | Kim et al. |
| 2012/0204938 | A1 | 8/2012 | Hacke et al. |
| 2012/0308476 | A1 | 12/2012 | Kim et al. |

FOREIGN PATENT DOCUMENTS

| | | |
|---|---|---|
| WO | 2008080160 A | 7/2008 |
| WO | 2009019940 A1 | 2/2009 |
| WO | 2009032021 A | 3/2009 |
| WO | 2013090562 A | 6/2013 |

OTHER PUBLICATIONS

Lui and Yasui, "Electroformed Al contact solar cells without soldering, investigating process parameters effects on performance", IEEE Photovoltaic Specialist Conf., Aug. 4-6, 1970, p. 62-69.

Notice of Allowance and Fees dated Sep. 18, 2013 for U.S. Appl. No. 13/798,124.

Office Action dated Nov. 12, 2013 for U.S. Appl. No. 13/798,123.

International Search Report and Written Opinion dated Jun. 16, 2014 for PCT Patent Application No. PCT/US2014/022216.

International Search Report and Written Opinion dated May 29, 2014 for PCT Application No. PCT/US2014/018489.

International Search Report and Written Opinion dated May 28, 2014 for PCT Patent Application No. PCT/US2014/018490.

International Search Report and Written Opinion dated May 28, 2014 for PCT Patent Application No. PCT/US2014/018494.

Lui and Yasui, Electroformed Al Contact Solar Cells without Soldering, investigating process parameters effects on performance. IEEE Photovoltaic Specialist Conference, Aug. 4-6, 1970, pp. 62-69.

Office Action dated Apr. 10, 2014 for U.S. Appl. No. 14/045,780.

Office Action dated Apr. 29, 2014 for U.S. Appl. No. 13/798,123.

Office Action dated Feb. 24, 2014 for U.S. Appl. No. 13/798,123.

Office Action dated Sep. 9, 2014 for U.S. Appl. No. 14/045,780.

* cited by examiner

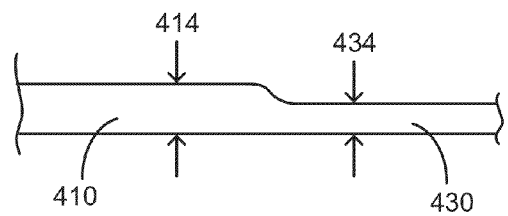
FIG. 5
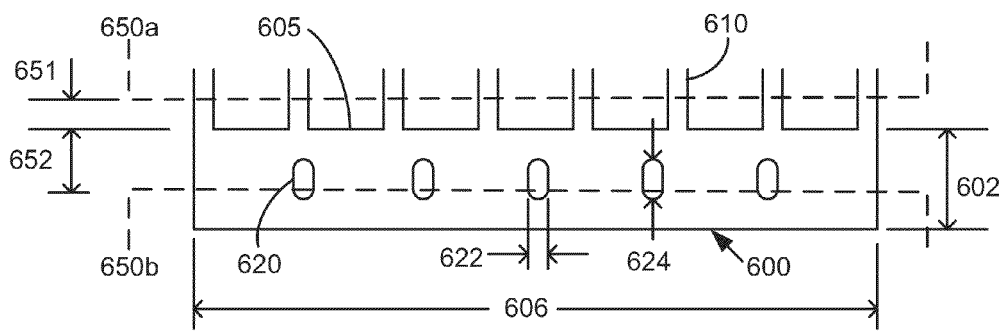
FIG. 6
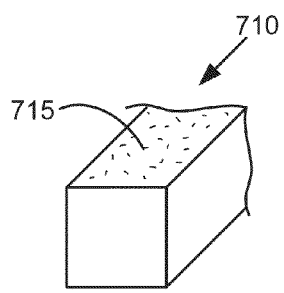 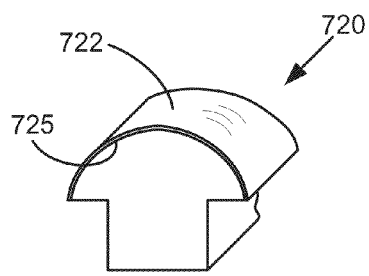
FIG. 7A                FIG. 7B

US 8,936,709 B2

ADAPTABLE FREE-STANDING METALLIC ARTICLE FOR SEMICONDUCTORS

RELATED APPLICATIONS

This application is a continuation-in-part of Babayan et al., U.S. patent application Ser. No. 13/798,123 entitled "Free-Standing Metallic Article for Semiconductors" and filed on Mar. 13, 2013, which is owned by the assignee of the present application and is hereby incorporated by reference. This application is also related to Brainard et al., U.S. patent application Ser. No. 14/079,544, entitled "Free-Standing Metallic Article With Expansion Segment" and filed on Nov. 13, 2013, which is owned by the assignee of the present application and is hereby incorporated by reference.

BACKGROUND OF THE INVENTION

A solar cell is a device that converts photons into electrical energy. The electrical energy produced by the cell is collected through electrical contacts coupled to the semiconductor material, and is routed through interconnections with other photovoltaic cells in a module. The "standard cell" model of a solar cell has a semiconductor material, used to absorb the incoming solar energy and convert it to electrical energy, placed below an anti-reflective coating (ARC) layer, and above a metal backsheet. Electrical contact is typically made to the semiconductor surface with fire-through paste, which is metal paste that is heated such that the paste diffuses through the ARC layer and contacts the surface of the cell. The paste is generally patterned into a set of fingers and bus bars which will then be soldered with ribbon to other cells to create a module. Another type of solar cell has a semiconductor material sandwiched between transparent conductive oxide layers (TCO's), which are then coated with a final layer of conductive paste that is also configured in a finger/bus bar pattern.

In both these types of cells, the metal paste, which is typically silver, works to enable current flow in the horizontal direction (parallel to the cell surface), allowing connections between the solar cells to be made towards the creation of a module. Solar cell metallization is most commonly done by screen printing a silver paste onto the cell, curing the paste, and then soldering ribbon across the screen printed bus bars. However, silver is expensive relative to other components of a solar cell, and can contribute a high percentage of the overall cost.

To reduce silver cost, alternate methods for metallizing solar cells are known in the art. For example, attempts have been made to replace silver with copper, by plating copper directly onto the solar cell. However, a drawback of copper plating is contamination of the cell with copper, which impacts reliability. Plating throughput and yield can also be issues when directly plating onto the cell due to the many steps required for plating, such as depositing seed layers, applying masks, and etching or laser scribing away plated areas to form the desired patterns. Other methods for forming electrical conduits on solar cells include utilizing arrangements of parallel wires or polymeric sheets encasing electrically conductive wires, and laying them onto a cell.

SUMMARY OF THE INVENTION

A free-standing metallic article, and method of making, is disclosed in which a metallic article is electroformed on an electrically conductive mandrel. The metallic article has a plurality of electroformed elements that are configured to serve as an electrical conduit for a photovoltaic cell. A first electroformed element has at least one of: a) a non-uniform width along a first length of the first element, b) a change in conduit direction along the first length of the first element, c) an expansion segment along the first length of the first element, d) a first width that is different from a second width of a second element in the plurality of electroformed elements, e) a first height that is different from a second height of the second element in the plurality of electroformed elements, and f) a top surface that is textured.

BRIEF DESCRIPTION OF THE DRAWINGS

Each of the aspects and embodiments of the invention described herein can be used alone or in combination with one another. The aspects and embodiments will now be described with reference to the attached drawings.

FIG. 5 is an exemplary partial cross-section of section C of FIG. 4.

FIG. 6 is a detailed top view of an interconnection area, in one embodiment.

FIGS. 7A-7B are vertical cross-sections of section D of FIG. 4, in certain embodiments.

DETAILED DESCRIPTION OF THE EMBODIMENTS

Metallization of solar cells is conventionally achieved with screen printed silver pastes on the surface of the cell, and cell-to-cell interconnections that utilize solder-coated ribbons. For a given aspect ratio of a metal conduit, the electrical resistance is inversely proportional to its footprint. Therefore, the cell metallization or cell-to-cell interconnection design usually trades off between shading and resistance for the most optimized solar cell module power output. The metallic articles of the present disclosure, which shall also be referred to as grids or meshes, can be used to replace conventional silver paste and solder coated ribbons and have adaptable features that allow for decoupling of factors that conventionally require trade-offs between functional requirements.

In Babayan et al., U.S. patent application Ser. No. 13/798,123, electrical conduits for semiconductors such as photovoltaic cells are fabricated as an electroformed free-standing metallic article. The metallic articles are produced separately from a solar cell and can include multiple elements such as fingers and bus bars that can be transferred stably as a unitary piece and easily aligned to a semiconductor device. The elements of the metallic article are formed integrally with each other in the electroforming process. The metallic article is manufactured in an electroforming mandrel, which generates a patterned metal layer that is tailored for a solar cell or other semiconductor device. For example, the metallic article may have grid lines with height-to-width aspect ratios that minimize shading for a solar cell. The metallic article can replace conventional bus bar metallization and ribbon stringing for cell metallization, cell-to-cell interconnection and module making. The ability to produce the metallization layer for a photovoltaic cell as an independent component that can be stably transferred between processing steps provides various advantages in material costs and manufacturing.

Figure 1:
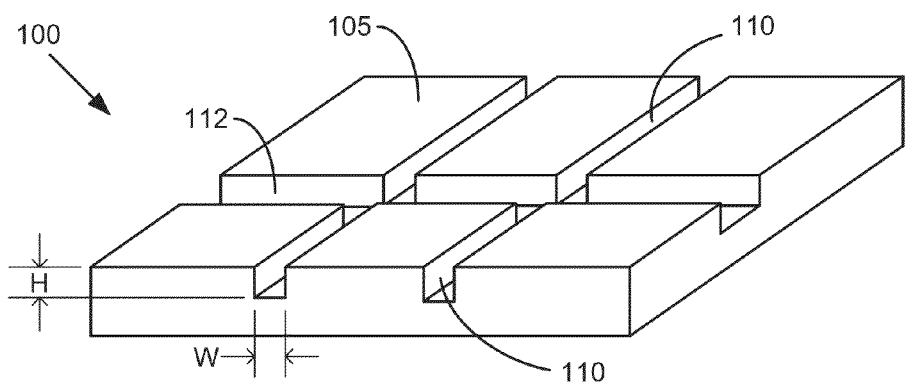
FIG. 1 shows a perspective view of an exemplary electroforming mandrel in one embodiment.

FIG. 1 depicts a perspective view of a portion of an exemplary electroforming mandrel 100 in one embodiment of U.S. patent application Ser. No. 13/798,123. The mandrel 100 may be made of electrically conductive material such stainless steel, copper, anodized aluminum, titanium, or molybdenum, nickel, nickel-iron alloy (e.g., Invar), copper, or any combinations of these metals, and may be designed with sufficient area to allow for high plating currents and enable high throughput. The mandrel 100 has an outer surface 105 with a preformed pattern that comprises pattern elements 110 and 112 and can be customized for a desired shape of the electrical conduit element to be produced. In this embodiment, the pattern elements 110 and 112 are grooves or trenches with a rectangular cross-section, although in other embodiments, the pattern elements 110 and 112 may have other cross-sectional shapes. The pattern elements 110 and 112 are depicted as intersecting segments to form a grid-type pattern, in which sets of parallel lines intersect perpendicularly to each other in this embodiment.

The pattern elements 110 have a height 'H' and width 'W', where the height-to-width ratio defines an aspect ratio. By using the pattern elements 110 and 112 in the mandrel 100 to form a metallic article, the electroformed metallic parts can be tailored for photovoltaic applications. For example, the aspect ratio may be between about 0.01 and about 10 as desired, to meet shading constraints of a solar cell.

The aspect ratio, as well as the cross-sectional shape and longitudinal layout of the pattern elements, may be designed to meet desired specifications such as electrical current capacity, series resistance, shading losses, and cell layout. Any electroforming process can be used. For example, the metallic article may be formed by an electroplating process. In particular, because electroplating is generally an isotropic process, confining the electroplating with a pattern mandrel to customize the shape of the parts is a significant improvement for maximizing efficiency. Furthermore, although certain cross-sectional shapes may be unstable when placing them on a semiconductor surface, the customized patterns that may be produced through the use of a mandrel allows for features such as interconnecting lines to provide stability for these conduits. In some embodiments, for example, the preformed patterns may be configured as a continuous grid with intersecting lines. This configuration not only provides mechanical stability to the plurality of electroformed elements that form the grid, but also enables a low series resistance since the current is spread over more conduits. A grid-type structure can also increase the robustness of a cell. For example, if some portion of the grid becomes broken or non-functional, the electrical current can flow around the broken area due to the presence of the grid pattern.

Figure 2A:
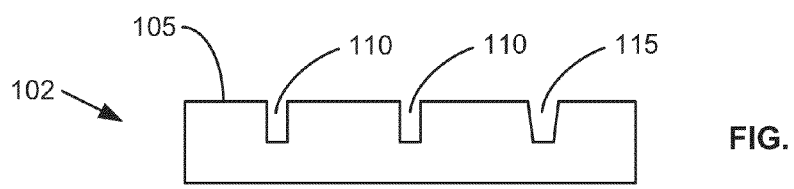
FIGS. 2A-2C depict cross-sectional views of exemplary stages in producing a free-standing electroformed metallic article.
Figure 2B:
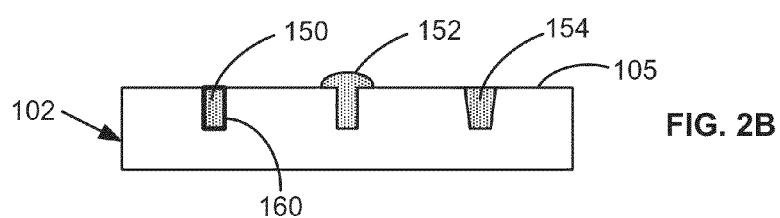
Figure 2C:
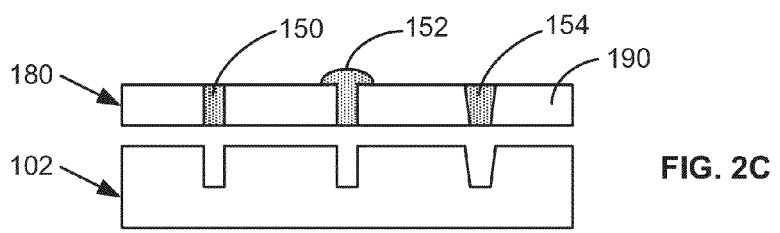

FIGS. 2A-2C are simplified cross-sectional views of exemplary stages in producing a metal layer piece using a mandrel, as disclosed in U.S. patent application Ser. No. 13/798,123. In FIG. 2A, a mandrel 102 with pattern elements 110 and 115 is provided. Pattern element 115 has a vertical cross-section that is tapered, being wider toward the outer surface 105 of the mandrel 102. The tapered vertical cross-section may provide certain functional benefits, such as increasing the amount of metal to improve electrical conductivity, or aiding in removal of the electroformed piece from the mandrel 102. The mandrel 102 is subjected to an electroforming process, in which exemplary electroformed elements 150, 152 and 154 are formed within the pattern elements 110 and 115 as shown in FIG. 2B. The electroformed elements 150, 152 and 154 may be, for example, copper only, or alloys of copper. In other embodiments, a layer of nickel may be plated onto the mandrel 102 first, followed by copper so that the nickel provides a barrier against copper contamination of a finished semiconductor device. An additional nickel layer may optionally be plated over the top of the electroformed elements to encapsulate the copper, as depicted by nickel layer 160 on electroformed element 150 in FIG. 2B. In other embodiments, multiple layers may be plated within the pattern elements 110 and 115, using various metals as desired to achieve the necessary properties of the metallic article to be produced.

In FIG. 2B the electroformed elements 150 and 154 are shown as being formed flush with the outer surface 105 of mandrel 102. Electroformed element 152 illustrates another embodiment in which the elements may be overplated. For electroformed element 152, electroplating continues until the metal extends above the surface 105 of mandrel 102. The overplated portion, which typically will form as a rounded top due to the isotropic nature of electroforming, may serve as a handle to facilitate the extraction of the electroformed element 152 from mandrel 102. The rounded top of electroformed element 152 may also provide optical advantages in a photovoltaic cell by, for example, being a refractive surface to aid in light collection. In yet other embodiments not shown, a metallic article may have portions that are formed on top of the mandrel surface 105, such as a bus bar, in addition to those that are formed within the preformed patterns 110 and 115.

In FIG. 2C the electroformed elements 150, 152 and 154 are removed from the mandrel 102 as a free-standing metallic article 180. Note that FIGS. 2A-2C demonstrate three different types of electroformed elements 150, 152 and 154. In various embodiments, the electroformed elements within the mandrel 102 may be all of the same type, or may have different combinations of electroformed patterns. The metallic article 180 may include intersecting elements 190, such as would be formed by the cross-member patterns 112 of FIG. 1. The intersecting elements 190 may assist in making the metallic article 180 a unitary, free-standing piece such that it may be easily transferred to other processing steps while keeping the individual elements 150, 152 and 154 aligned with each other. The additional processing steps may include coating steps for the free-standing metallic article 180 and assembly steps to incorporate it into a semiconductor device. By producing the metal layer of a semiconductor as a free-standing piece, the manufacturing yields of the overall semiconductor assembly will not be affected by the yields of the metal layer. In addition, the metal layer can be subjected to temperatures and processes separate from the other semiconductor layers. For example, the metal layer may be undergo high temperature processes or chemical baths that will not affect the rest of the semiconductor assembly.

After the metallic article 180 is removed from mandrel 102 in FIG. 2C, the mandrel 102 may be reused to produce additional parts. Being able to reuse the mandrel 102 provides a significant cost reduction compared to current techniques where electroplating is performed directly on a solar cell. In direct electroplating methods, masks or mandrels are formed on the cell itself, and thus must be built and often destroyed on every cell. Having a reusable mandrel reduces processing steps and saves cost compared to techniques that require patterning and then plating a semiconductor device. In other conventional methods, a thin printed seed layer is applied to a semiconductor surface to begin the plating process. However, seed layer methods result in low throughputs. In contrast, reusable mandrel methods as described herein can utilize mandrels of thick metal which allow for high current capability, resulting in high plating currents and thus high throughputs. Metal mandrel thicknesses may be, for example, between 0.2 to 5 mm.

Figure 3A:
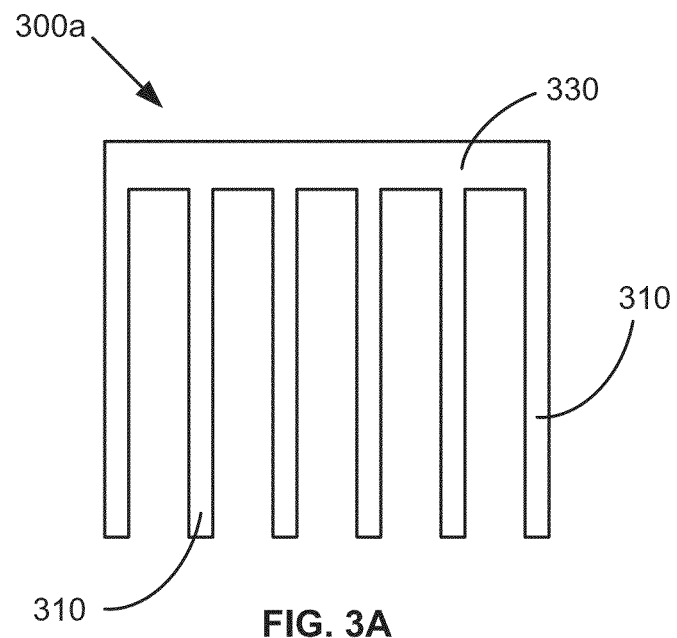
FIGS. 3A-3B are top views of two embodiments of metallic articles.
Figure 3B:
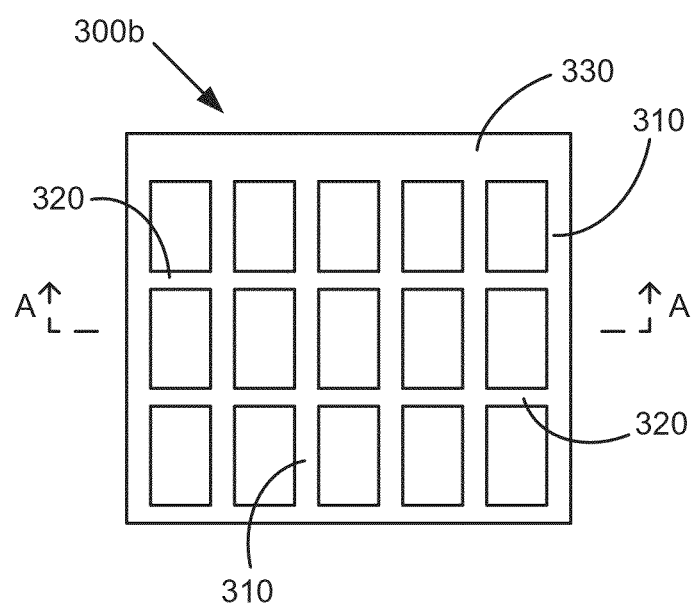

FIGS. 3A and 3B illustrate top views of exemplary metal layers 300a and 300b that may be produced by the electroforming mandrels described herein. Metal layers 300a and 300b include electroformed elements embodied here as substantially parallel fingers 310, which have been formed by substantially parallel grooves in an electrically conductive mandrel. Metal layer 300b also includes electroformed elements embodied here as horizontal fingers 320 that intersect vertical fingers 310, where the fingers 310 and 320 intersect at approximately a perpendicular angle. In other embodiments, fingers 310 and 320 may intersect at other angles, while still forming a continuous grid or mesh pattern. Metal layers 300a and 300b also include a frame element 330 which may serve as a bus bar to collect current from the fingers 310 and 320. Having a bus bar integrally formed as part of the metallic article can provide manufacturing improvements. In present high-volume methods of solar module production, cell connections are often achieved by manually soldering metal ribbons to the cells. This commonly results in broken or damaged cells due to manual handling and stress imparted on the cells by the solder ribbons. In addition, the manual soldering process results in high labor-related production costs. Thus, having a bus bar or ribbon already formed and connected to the metallization layer, as is possible with the electroformed metallic articles described herein, enables low-cost, automated manufacturing methods.

Frame element 330 may also provide mechanical stability such that metal layers 300a and 300b are unitary, free-standing pieces when removed from a mandrel. That is, the metal layers 300a and 300b are unitary in that they are a single component, with the fingers 310 and 320 remaining connected, when apart from a photovoltaic cell or other semiconductor assembly. Frame element 330 may furthermore assist in maintaining spacing and alignment between finger elements 310 and 320 for when they are to be attached to a photovoltaic cell. Frame element 330 is shown in FIGS. 3A-3B as extending across one edge of metal layers 300a and 300b. However, in other embodiments, a frame element may extend only partially across one edge, or may border more than one edge, or may be configured as one or more tabs on an edge, or may reside within the grid itself. Furthermore, frame element 330 may be electroformed at the same time as the fingers 310 and 320, or in other embodiments may be electroformed in a separate step, after fingers 310 and 320 have been formed.

Figure 3C:
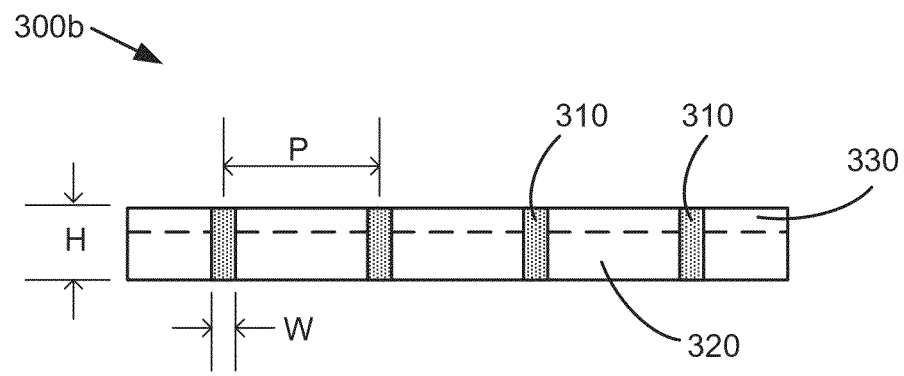
FIG. 3C is a cross-sectional view of section A-A of FIG. 3B.

FIG. 3C shows a cross-section of metal layer 300b taken at section A-A of FIG. 3B. Fingers 310 in this embodiment are shown in as having aspect ratios greater than 1, such as about 1 to about 5, and such as approximately 2 in this figure. Having a cross-sectional height greater than the width reduces the shading impact of metal layer 300b on a photovoltaic cell. In various embodiments, only a portion of the fingers 310 and 320 may have an aspect ratio greater than 1, or a majority of the fingers 310 and 320 may have an aspect ratio greater than 1. In other embodiment, some or all of the fingers 310 and 320 may have an aspect ratio less than 1. Height 'H' of fingers 310 may range from, for example, about 5 microns to about 200 microns, or about 10 microns to about 300 microns. Width 'W' of fingers 310 may range from, for example, about 10 microns to about 5 mm, such as about 10 microns to about 150 microns. The distance between parallel fingers 310 has a pitch 'P', measured between the centerline of each finger. In some embodiments the pitch may range, for example, between about 1 mm and about 25 mm. In FIGS. 3B and 3C, the fingers 310 and 320 have different widths and pitches, but are approximately equivalent in height. In other embodiments, the fingers 310 and 320 may have different widths, heights and pitches as each other, or may have some characteristics that are the same, or may have all the characteristics the same. The values may be chosen according to factors such as the size of the photovoltaic cell, the shading amount for a desired efficiency, or whether the metallic article is to be coupled to the front or rear of the cell. In some embodiments, fingers 310 may have a pitch between about 1.5 mm and about 6 mm and fingers 320 may have a pitch between about 1.5 mm and about 25 mm. Fingers 310 and 320 are formed in mandrels having grooves that are substantially the same shape and spacing as fingers 310 and 320. Frame element 330 may have the same height as the fingers 310 and 320, or may be a thinner piece as indicated by the dashed line in FIG. 3C. In other embodiments, frame element 330 may be formed on above finger elements 310 and 320.

Figure 3D:
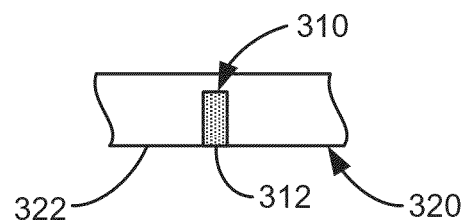
FIGS. 3D-3E are partial cross-sectional views of yet further embodiments of the cross-section of FIG. 3B.
Figure 3E:
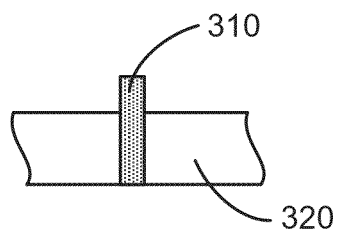

FIG. 3C also shows that fingers 310 and 320 may be substantially coplanar with each other, in that the fingers 310 and fingers 320 have a majority of their cross-sectional areas that overlap each other. Compared to conventional meshes that are woven over and under each other, a coplanar grid as depicted in FIG. 3C can provide a lower profile than overlapping circular wires of the same cross-sectional area. The intersecting, coplanar lines of metal layer 300b are also formed integrally with each other during the electroforming process, which provides further robustness to the free-standing article of metal layer 300b. That is, the integral elements are formed as one piece and not joined together from separate components. FIGS. 3D and 3E show other embodiments of coplanar, intersecting elements. In FIG. 3D, finger 310 is shorter in height than finger 320 but is positioned within the cross-sectional height of finger 320. Fingers 310 and 320 have bottom surfaces 312 and 322, respectively, that are aligned in this embodiment, such as to provide an even surface for mounting to a semiconductor surface. In the embodiment of FIG. 3E, finger 310 has a larger height than finger 320 and extends beyond the top surface of finger 320. A majority of the cross-sectional area of finger 310 overlaps the entire cross-section of finger 320, and therefore fingers 310 and 320 are coplanar as defined in this disclosure.

Figure 3F:
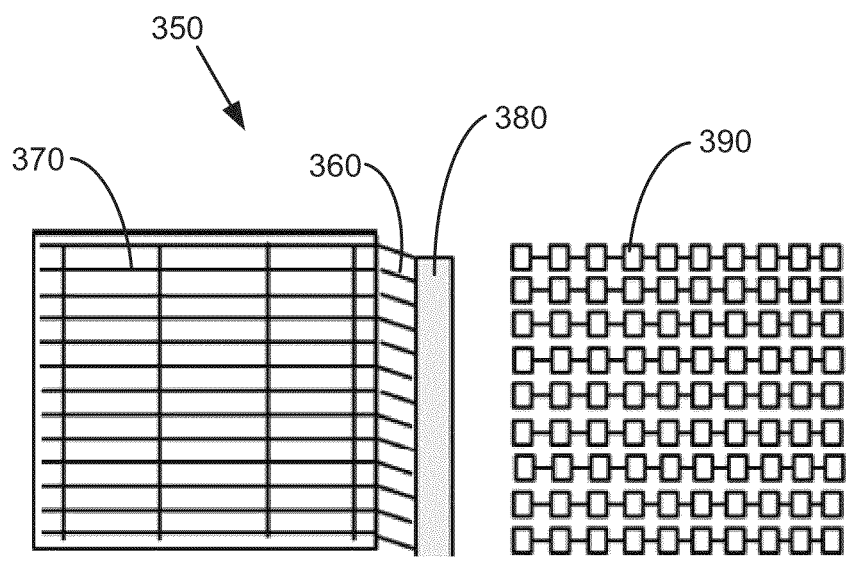
FIGS. 3F-3G are top views of embodiments of metallic articles with interconnection elements.
Figure 3G:
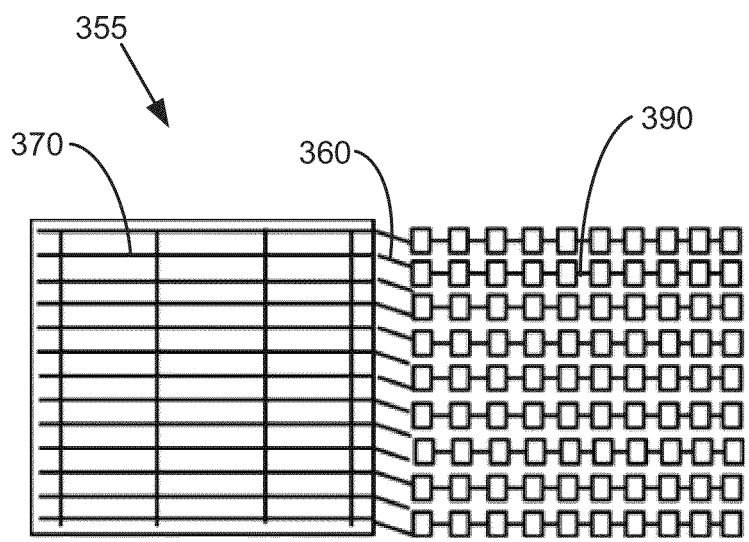

FIGS. 3F and 3G show yet other embodiments, in which electroformed metallic articles enable interconnections between photovoltaic cells in a module. A typical module has many cells, such as between 36-60, connected in series. The connections are made by attaching the front of one cell to the back of the next cell using solder-coated copper ribbon. Attaching the ribbon in this way requires a ribbon that is thin, so that the ribbon can bend around the cells without breaking the cell edges. Because a ribbon is already narrow, using a thin ribbon increases the resistance even further. The interconnections also typically require three separate ribbons, each soldered separately. In the embodiment of FIG. 3F, a metallic article 350 has interconnection elements 360 that have been integrally electroformed with a first grid region 370. Interconnection elements 360 have a first end coupled to grid 370, and are configured to extend beyond the surface of a photovoltaic cell to allow connection to a neighboring cell. The interconnection elements 360 replace the need for a separate ribbon to be soldered between cells, thus reducing manufacturing costs and enabling possible automation. In the embodiment shown, interconnection elements 360 are linear segments, although other configurations are possible. Also, the number of interconnection elements 360 can vary as desired, such as providing multiple elements 360 to reduce resistance. Interconnection elements 360 may be bent or angled after electroforming, such as to enable a front-to-back connection between cells, or may be fabricated in the mandrel to be angled relative to the grid 370.

The opposite end of interconnection elements 360 may be coupled to a second region 380, where the second region 380 may also be electroformed in an electrically conductive mandrel as part of the metallic article 350. In FIG. 3F, the second region 380 is configured as a tab—e.g., a bus bar—that may then be electrically connected to an electrical conduit 390 of a neighboring cell. The conduit 390 is configured here as an array of elements, but other configurations are possible. Grid 370 may, for example, serve as an electrical conduit on a front surface of a first cell, while grid 390 may be an electrical conduit on a rear surface of a second cell. In the embodiment of FIG. 3G, a metallic article 355 has a mesh instead of a bus bar type of connection. Metallic article 355 includes first region 370, interconnection elements 360 and second region 390 that have all been electroformed as a single component, such that the inter-cell connections are already provided by metallic article 355. Thus the metallic articles 350 and 355 provide electrical conduits not only on a surface of one photovoltaic cell, but also the interconnections between cells.

Metallic articles fabricated by an electroforming mandrel enable features to be tailored even further to meet desired functional and manufacturing needs of a particular photovoltaic cell. For example, individual shapes of elements within the metallic article can be custom-designed, or elements in one region of the metallic article can be designed with features geometrically different from elements in another region. The customized features described herein may be used individually or in combination with each other. The use of an electroforming mandrel decouples dimensional constraints of the overall electroformed piece so that the features may be optimized for a particular area within the metallic article. Furthermore, the metallic articles produced by the present methods enable tailoring for a particular type of cell, such as lower-cost residential versus high-efficiency cells. Features of the metallic articles also allow for integration of interconnection components, so that solar cells that utilize the metallic articles as electrical conduits are module-ready. The metallization provided by the metallic articles described herein provide a higher metallization volume and lower resistance than traditional cell metallizations with the same footprint, while reducing cost compared to silver-based and ribbon-based metallization. The metallic articles also facilitate light-weight and sag-tolerant photovoltaic cells designs.

Figure 4:
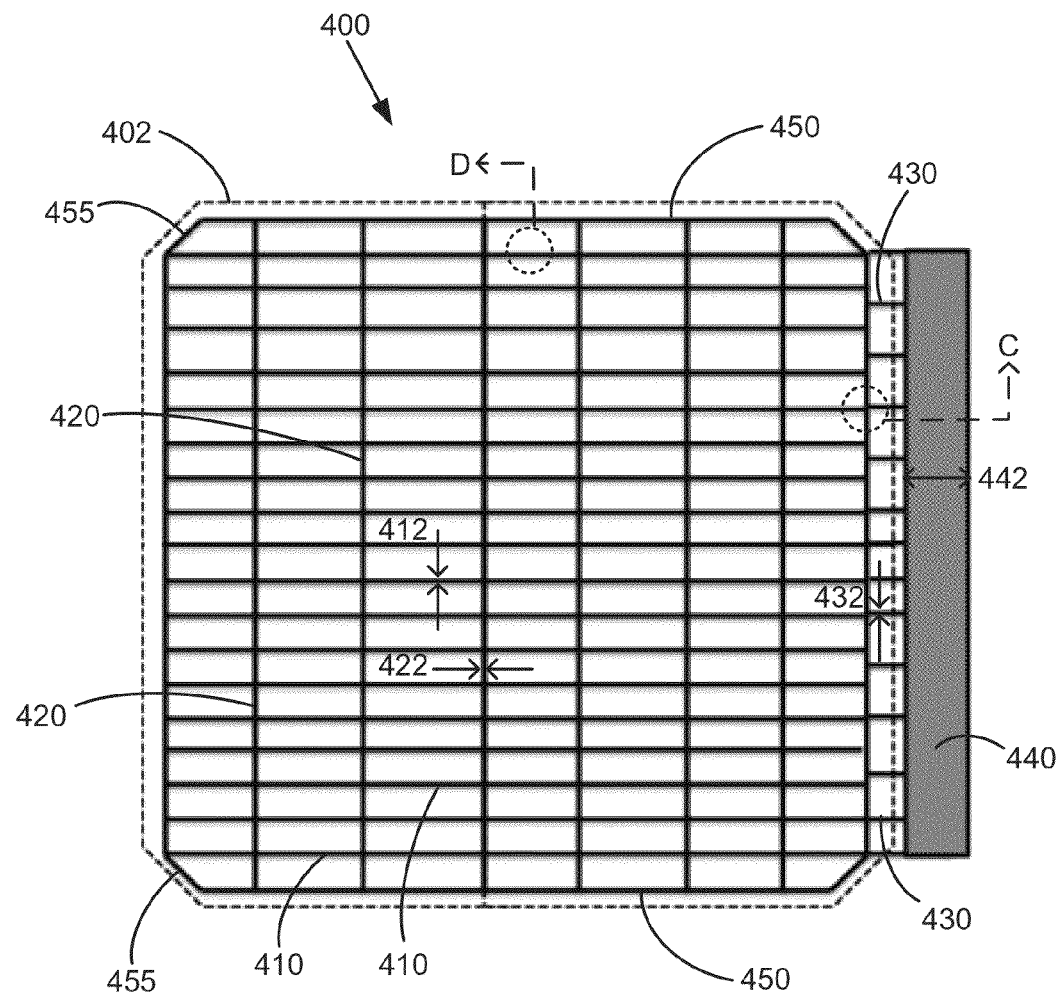
FIG. 4 provides a top view of a metallic article with adaptable features, in one embodiment.

FIG. 4 shows a top view of a metallic article 400 with embodiments of various features adapted for a photovoltaic cell. A semiconductor substrate 402 is shown in dashed lines to demonstrate the placement of metallic article on a photovoltaic cell, where the metallic article 400 is configured here as a grid for the front side of the cell. However, the features described herein may be applied to an electrical conduit for the back side of a photovoltaic cell. In this disclosure, reference to semiconductor materials in formation of a semiconductor device or photovoltaic cell may include amorphous silicon, crystalline silicon or any other semiconductor material suitable for use in a photovoltaic cell. The metallic articles may be also applied to other types of semiconductor devices other than photovoltaic cells. Semiconductor substrate 402 is shown in FIG. 4 as a mono-crystalline cell with rounded corners, also referred to as a pseudosquare shape. In other embodiments, the semiconductor substrate may be multi-crystalline, with a fully square shape. Semiconductor substrate 402 may have electrical conduit lines (not shown) on its surface, such as silver fingers, that carry current generated by substrate 402. The silver fingers may be screen-printed onto the semiconductor substrate 402 according to conventional methods. For example, the silver fingers may be lines that are perpendicular to the direction of grid lines 410. The elements of metallic article 400 then serve as electrical conduits to carry electrical current from the silver fingers. In this embodiment of FIG. 4, grid lines 410 (horizontal in FIG. 4) and 420 (vertical in FIG. 4) of metallic article 400 are electrically coupled to the semiconductor substrate 402, such as by soldering, to collect and deliver the current to interconnection elements 430 and 440. As described in FIGS. 3F-3G, interconnection elements enable cell-to-cell connections for a solar module. Fabricating metallic article 400 with a metal such as copper reduces the cost compared to a cell in which silver is used for all the electrical conduits, and can also improve cell efficiency due to improved conductivity.

The grid lines 410 and 420 of FIG. 4 are shown as approximately perpendicular to each other; however, in other embodiments they may be at non-perpendicular angles to each other. Although both the grid lines 410 and intersecting grid lines 420 are capable of carrying electrical current, grid lines 410 provide the path of least resistance to interconnection elements 430 and 440 and would function as the primary carriers of electrical current. Thus, grid lines 410 shall also be referred to as bus bars, while the intersecting grid lines 420 may be referred to as cross members. Cross members 420 provide mechanical support for the free-standing metallic article 400, both in terms of strength and in maintaining dimensional specifications of the grid. However, cross members 420 can also serve as electrical conduits, such as in providing redundancy if a bus bar 410 should fail. In some embodiments, grid lines 410 and 420 may have widths 412 and 422, respectively, that differ from each other such as to optimize mechanical strength or achieve a desired fill factor for the cell. For example, width 412 of grid lines 410 may be smaller than width 422 of grid lines 420, so that grid lines 420 provide sufficient mechanical stability for metallic article 400 while grid lines 410 are tailored to achieve as high a fill factor as possible. In further embodiments, certain grid lines 410 may have different widths than other grid lines 410, such as to address mechanical strength or electrical capacity of a particular zone. The pitch of bus bars 410 may also vary from the cross members 420, or may vary from each other in different regions within metallic article 400 to meet required device conduction requirements. In some embodiments, a coarser or finer mesh pitch may be chosen based on, for example, the silver finger designs of the wafer, the precision of the silver screen printing process, or the type of cell being used.

Grid lines 410 and 420 also include edge members 450 and 455, which are configured to be located near the perimeter of a solar cell. For instance, the edge members 450 and 455 may be located 1-3 mm from the edges of the wafer 402. Because edge members 450 and 455 form the perimeter of metallic article 400, edge members 450 and 455 may be wider than other grid lines 410 and 420 in the interior of metallic article 400, to provide additional structural support. Edge members 455 are configured as corner bus bars in the embodiment of FIG. 4, that form an angle from the main edge member 450. That is, edge member 450 has a change in conduit direction along the length, such as to accommodate a pseudosquare shape in this embodiment. This change in direction can be integrally formed by the electroforming mandrel, and can include tailoring the width of the corner bus bar 455 for improving mechanical strength and reducing resistive losses. Wider bus bars 450 and 455 at the perimeter of metallic article 400 can also improve the bonding strength when attaching the metallic article 400 to the semiconductor substrate 402.

Interconnection elements 430 and 440 are near an edge of the metallic article 400, and may also have widths 432 and 442 that are different from other areas of metallic article 400. For instance, interconnection element 430 may have a width 432 that is larger than width 412 of grid lines 410. Thus, the width 432 is decoupled from the width constraints on the face of the cell, and allows for lower electrical resistance without affecting the cell active area. Because the electroforming process is isotropic, an increased width 432 may result in a thinner height of interconnection elements 430. FIG. 5 shows a vertical cross-section of section C in FIG. 4, showing an exemplary height difference between elements 410 and 430. In FIG. 5, grid line 410 has a height 414 that is greater than height 434 of interconnection element 430. That is, the grid line 410 at the wafer edge is narrower and taller compared to the interconnect 430 which is wider and thinner. The thinner interconnect 430 can improve resistance to fatigue failure—such as flexing during transportation and exposure to environmental forces—while minimizing voltage loss by providing a large surface area for current flow. For example, in some embodiments the thickness, or height 434, of the interconnect 430 may be 40-120 µm, such as 50-70 µm, while the grid lines 410 may have a thickness or height 414 of 100-200 µm, such as 100-150 µm.

FIG. 6 shows a detailed top view of an exemplary interconnect element 600, similar to interconnect element 440 of FIG. 4. The interconnect element 600 serves as a solder pad for the back of an adjacent cell, while the interconnect elements 610 serve as electrical conduits between solar cells. Note that the plate-type design of interconnect 600 has a large surface area compared to conventional solder ribbons, such as 5 times or 10 times more than conventional cells in which three bus ribbons are used. Consequently the design of interconnect 600 improves efficiency at the module level by providing low series resistance and minimal voltage drop. For example, the width 602 of interconnect element 600 may be 5-10 mm, such as 6-8 mm, compared to a width of 50-100 µm for grid lines 410 and 420 of FIG. 4. The length 606 of interconnect element 600 may approximate the edge length of a photovoltaic cell, such as the entire edge of a multi-crystalline cell or the length between corners of a mono-crystalline cell. The interconnect element 600 can also serve as a manufacturing aid for removing the metallic article (e.g., metallic article 400 of FIG. 4) from the electroforming mandrel. Interconnection elements 610 may be bent or angled after electroforming, such as to enable a front-to-back connection between cells. The interconnect elements 600 and 610 may be formed integrally with the grid lines 410 and 420, which can reduce manufacturing cost by eliminating joining steps. In other embodiments the interconnect elements 600 and/or 610 can be formed as a separate piece and then joined to the grid lines 410 and 420, such as to allow for interchangeability of interconnection elements with different grid designs.

Interconnect elements 600 and 610 can have heights—that is, thicknesses—that are different from the rest of metallic article 400, similar to the height difference of grid lines 410 and interconnect element 430 shown in FIG. 5. In some embodiments, for example, interconnect elements 610 may have a height of 50-70 µm and interconnect element 60 may have a height of 40-100 µm. Because interconnection elements 610 provide the mechanical, as well as electrical connections between cells in a module, the elements 610 may be tailored with a specific thickness to meet specified flex-testing requirements. The number of elements 610 can also be increased compared to single-ribbon attachments of conventional cells, to improve reliability and flex-testing endurance. An increased number of interconnect elements 610 also provides more electrical conduit area, and thus less resistance. In some embodiments, a metallic article having 15-30 interconnect elements 610 with a height of 50-70 µm has been found to endure more than ten to a hundred times the flex cycles-to-failure compared to conventional copper solder ribbons of 150 µm thickness.

FIG. 6 shows an additional feature of interconnect element 600 in that apertures 620 are present. Apertures 620 are openings through the thickness of interconnect element 600, in the form of circular, oval, or other shapes of holes or slits. These apertures 620 allow for release of trapped air during lamination of a photovoltaic cell assembly, thus facilitating void-free encapsulation. Dashed lines 650a and 650b represent the placement of semiconductor substrates in one embodiment, where substrate 650a represents attachment to the front side of a photovoltaic cell while substrate 650b is the attachment to the back side of an adjacent cell. Substrate 650a may be positioned, for example, with a gap 651 of 0.5-1.5 mm from the front edge 605 of interconnect element 600, while substrate 650b may be positioned, for example, with a gap 652 of 1.5-2.5 mm from the edge 605. As can be seen in FIG. 6, at least a portion of apertures 620 remains exposed between cells, allowing a module laminating material such as ethylene vinyl acetate (EVA) to penetrate interconnect element 600 for mechanical strength. The apertures 620 also provide a pathway for any air bubbles within the laminating material to escape. The number and sizes of apertures 620 may be chosen to facilitate the laminating process while balancing the amount of material needed in interconnect element 600 to meet electrical resistance and mechanical strength requirements. In some embodiments, the number of apertures 620 may range from, for example 1 to 10, with apertures 620 having a width 622 of 0.5-5 mm, such as 1-3 mm and length 624 of 1-6 mm, such as 3-5 mm. Apertures 620 may have interior corners that are rounded to maximize durability while allowing the flow of encapsulant.

FIGS. 7A-7B show vertical cross-sections of exemplary electroformed elements 710 and 720, such as taken across the width of gridline 410 as shown in section D in FIG. 4. The cross-sections 710 and 720 are similar to electroformed elements 150 and 152 of FIG. 2B, and are presented in FIGS. 7A-7B to demonstrate further customized features that may be incorporated into the top surfaces of metallic articles in the present disclosure. In FIG. 7A, element 710 has a rectangular cross-section with a top surface 715, where "top" refers to the light-incident surface when mounted on a photovoltaic cell. Top surface 715 may be configured to contribute to optical properties of the grid lines, such as to promote light reflection and thus enhance cell efficiency. In some embodiments, the texturing may be an intentional roughness to increase the surface area for capturing light. The roughness may be imparted, for example, by having a textured pattern incorporated into the electroforming mandrel. That is, the preformed pattern 110 of FIG. 1 may have a texture pattern formed into the mandrel 100, where the top surface 715 would be the surface produced by the bottom of preformed pattern 110. In another embodiment, the texturing may be produced by the electroforming process itself. In one exemplary process, a high electroplating current may be used for a fast electroforming rate, such as on the order of 1 to 3 µm/minute. This fast rate can result in the exposed surface—at the outer surface 105 of electroforming mandrel 100—being rough.

In yet other embodiments, a custom-configured top surface may be a particular surface finish that is created after formation of the electroformed part. For example, FIG. 7B shows an overplated element 720 having a coating layer 722 on its top surface 725. Coating 722 may include one or more layers of metals including, but not limited to, nickel, silver, tin, lead-tin or a solder. The coating 722 may, for example, produce a smooth surface to improve reflectivity of the rounded top surface 725. Applying solder as a coating on top surface 725, or 715, can also assist in enabling solder reflow for bonding, in addition to providing optical benefits.

Although element 710 is shown with a rectangular cross-section and element 720 is shown with a rectangular base and rounded top, other cross-sectional shapes are possible such as a hemisphere or elongated rectangle with rounded chamfers. These cross-sectional shapes may be the same throughout a metallic article or vary between different zones of the metallic article. Any curved or rounded edges of the top surface may be utilized to deflect incident light to the cell or reflect light to enable total internal reflection if inside a standard solar cell module. The surfaces may be coated with a highly reflective metal such as silver or tin to enhance both deflection and reflection, thus reducing the effective mesh shading area to less than its footprint.

Figure 8:
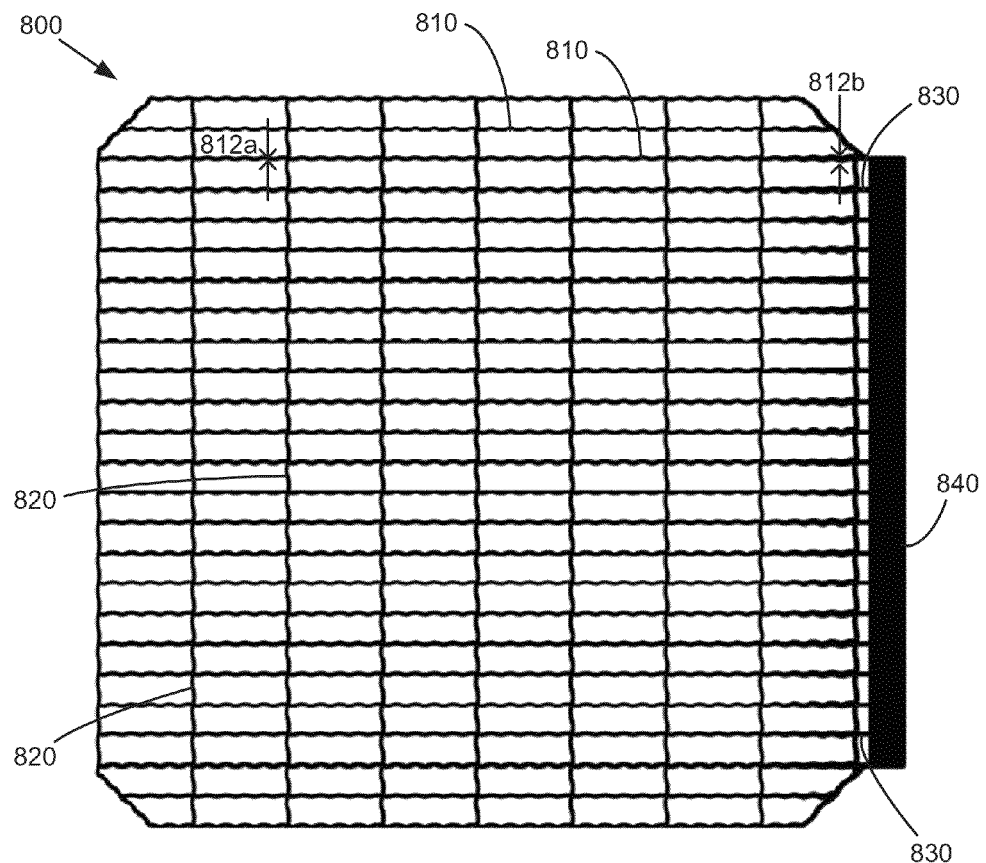
FIG. 8 shows a top view of a metallic article for the front side of a photovoltaic cell, with embodiments of adaptable features.

FIG. 8 shows a top view of an embodiment of another metallic article 800, showing further features that may be tailored. Metallic article 800 has intersecting grid lines 810 and 820 forming a mesh configuration over the majority of the metallic article 800, with interconnecting elements 830 and 840 at one end of the mesh. Grid lines 810 have a width that is non-uniform along its length, with the non-uniform width being designed into the electroforming mandrel in which metallic article 800 is fabricated. In the embodiment of FIG. 8, width 812a is smaller than width 812b nearer the interconnect element 840, which is the current collection end of the cell. This increased width 812b accommodates the higher electrical current at this end, as current is gathered by the metallic article across its surface. Thus the increased width 812b reduces resistive losses. The height of the grid line 810 may also be adjusted as desired in the areas of increased width, as described previously.

Figure 9:
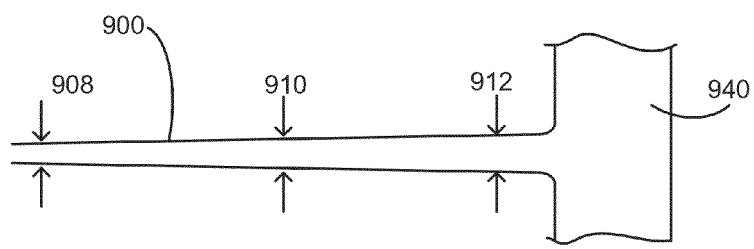
FIG. 9 is a detailed top view of an exemplary grid line with a tapered width along its length.

The amount of non-uniformity over the length of a grid line can be designed such that a desired fill factor of a photovoltaic cell is maintained. For example, FIG. 9 shows an exemplary linear grid line 900 having a nominal width 910. Nominal width 910 may be, for example, 50 to 300 µm. In this embodiment, width 908 near one end of grid line 900, such as away from the interconnect area 940, may be reduced by 10-30% compared to the nominal width 910. Width 912 near the interconnect area 940 may be increased by 10-30% compared to the nominal width 910. Thus, grid line 910 has a symmetrical tapering, with a reduction in width at one end and an increased width at the other end, resulting in the same fill factor as a grid line having the nominal width over its entire length.

The non-uniform widths of FIGS. 8 and 9 may occur continuously over the length of the grid in some embodiments, or may occur over one or more portions in other embodiments. In further embodiments, the width of the grid line 810 may increase and decrease over different portions, rather than having a single tapering rate. Additionally, the feature of having a non-uniform width along the length may be present in one, some, or all grid lines a metallic article.

Returning to FIG. 8, the grid lines 810 and 820 show another designed feature, in that the lengthwise profile can be altered in shape in addition to varying in width. In FIG. 8, the grid lines 810 and 820 are configured with a non-linear pattern that allows the grid lines to expand lengthwise, thus serving as an expansion segment. The patterns are formed by the electroforming mandrel in which metallic article 800 is created. In the embodiment of FIG. 8, the both grid lines 810 and 820 have a wave-type pattern, oriented parallel to the plane of the metallic article 800 so that the metallic article presents a flat surface for joining to a photovoltaic cell. The wave pattern may be configured as, for example, a sine-wave or other curved shape or geometries. The wave pattern provides extra length between solder points to allow the metallic article 800 to expand and contract, such as to provide strain relief for differences in coefficients of thermal expansion (CTE) between metallic article and the semiconductor substrate to which it is joined. For example, a copper has a CTE of around five times that of silicon. Thus, a copper metallic article soldered to a silicon substrate will experience significant strain during heating and cooling steps involved with manufacturing the sub-assembly into a finished solar cell.

The wave pattern is designed to allow sufficient expansion and contraction of the metallic article 800 to reduce or eliminate issues such as bowing or breakage due to CTE differences. The dimensions of the expansion segment are chosen to accommodate the differences in CTE of the specific materials being used. In some embodiments the wave pattern may have, for example, an amplitude of 200-300 µm and a wavelength of 1-10 mm to provide additional length compared to a fully linear segment. The expansion segment may also enable lower solder joint sizes, which consequently reduces shading, since the reduced strain requires less solder joint strength. Lower joint sizes may also enable larger bonding process windows, improving manufacturability and cost. Note that although in FIG. 8 all the grid lines 810 and 820 are configured as expansion segments, in other embodiments only certain grid lines may be configured as expansion segments. In yet further embodiments, only a certain portion of a single grid line may be configured as an expansion segment, while the remainder of the length is linear.

Figure 10A:
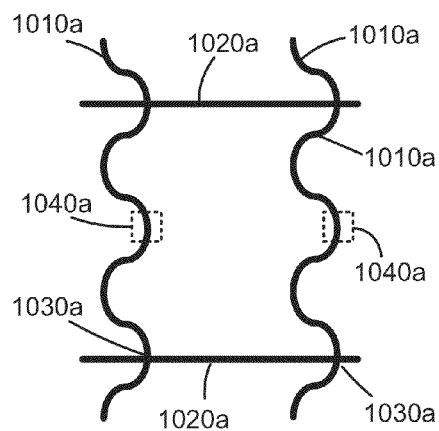
FIGS. 10A-10E are simplified schematics of various embodiments of expansion segments.

FIGS. 10A-10E are top views of various configurations of expansion segments in further embodiments. The metal grid lines are shown as single lines in these figures for clarity. Furthermore, although only a portion of the grid lines is shown, the entire grid line may have the same pattern, or alternatively, the remainder of the grid line may have a different pattern, and may vary in width. In FIG. 10A, bus bars 1010a have a wave pattern while cross members 1020a are linear. This design provides one-dimensional CTE stress relief in the direction of the bus bars 1010a. The points at which bus bars 1010a and cross members 1020a intersect shall be referred to as nodes 1030a. Solder pads 1040a represent silver, tin or similar solder pads on the semiconductor wafer to which the bus bars 1010*a* will be attached. Solder pads 1040*a* are shown in these figures as discrete areas; however, in other embodiments they may be lines extending partially or continuously across a semiconductor wafer. In FIG. 10A, the solder pads 1040*a* are located between nodes 1030*a*. In other embodiments, the solder pads 1040*a* may be positioned to align with nodes 1030*a*, or elsewhere on the grid lines 1010*a* and 1020*a*.

Figure 10B:
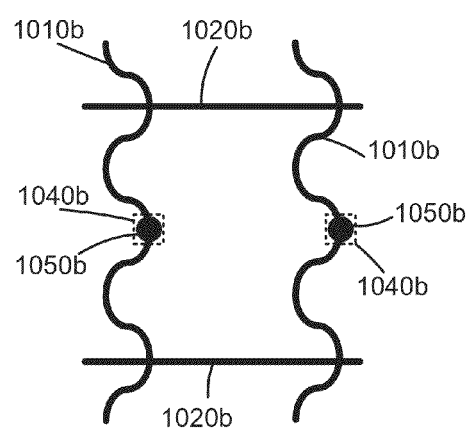

FIG. 10B is identical to FIG. 10A, except that bonding areas 1050*b* have been formed on bus bars 1010*b*. Bonding areas 1050*b* provide increased surface area for joining to solder pads 1040*b*, such as to increase bond strength and to widen manufacturing tolerances. Bonding areas 1050*b* may be configured as, for example, a circular pad as shown, or struts extending from bus bar 1010*b*, or other shapes. Note that in both FIGS. 10A and 10B, the direction of the expansion members is interchangeable. That is, cross members 1020*a/b* may be configured with the wave pattern while bus bars 1010*a/b* may be linear.

Figure 10C:
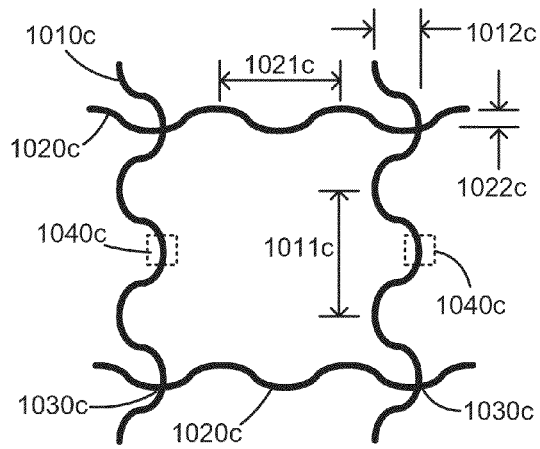

In FIG. 10C, both the bus bars 1010*c* and cross members 1020*c* are configured as expansion segments, thus allowing for two-dimensional stress relief. The bus bars 1010*c* are joined to solder pads 1040*c* between nodes 1030*c*. The bus bars 1010*c* and cross members 1020*c* both have wave patterns, where the period 1011*c* of bus bars 1010*c* is the same as the period 1021*c* of cross members 1020*c*. However, the amplitude 1012*c* of bus bar 1010*c* is different—larger in this embodiment—than amplitude 1022*c* of cross member 1020*c*. Thus it is seen that bus bars 1010*c* and cross members 1020*c* can be tailored individually from each other. In other embodiments, certain bus bars 1010*c* within a metallic article can have different amplitudes and periods than other bus bars 1010*c*. Similarly, cross members 1020*c* can have can have different amplitudes and periods than each other.

Figure 10D:
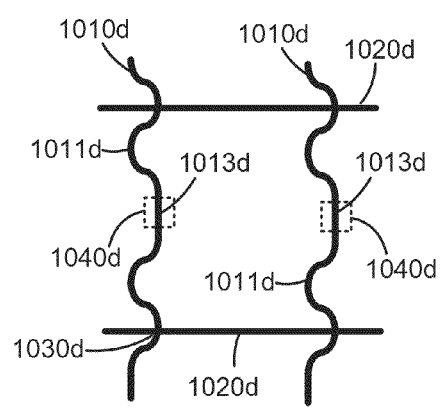

FIG. 10D shows yet another expansion segment configuration, in which bus bars 1010*d* have arched sections 1011*d* with intervening straight sections 1013*d* between nodes 1030*d*. Cross members 1020*d* are linear in this embodiment. The transitions between straight and arched sections 1011*d* and 1013*d* may be designed to be curved, as an absence of sharp corners may facilitate removal of the metallic article from the electroforming mandrel and reduce stress points. In this embodiment, straight sections 1013*d* have a length to extend across the solder pad 1040*d*. The straight sections 1013*d* may reduce the amount of strain at solder pads 1040*d*, since the stress will be applied along grid lines 1010*d* in only one direction. The straight sections 1013*d* may also reduce manufacturing tolerances required in aligning bus bars 1010*d* with solder pads 1040*d*. In other embodiments, the bus bars 1010*d* may also include straight portions at nodes 1030*d*, to reduce stress at the intersections between grid lines 1010*d* and 1020*d*.

Figure 10E:
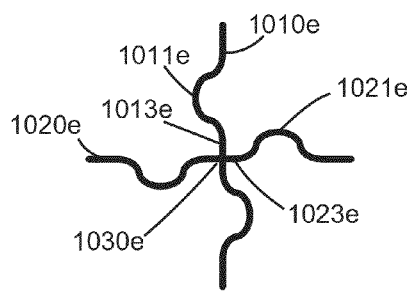

FIG. 10E shows a further embodiment in which bus bars 1010*e* and cross members 1020*e* have straight sections 1013*e* and 1023*e* alternating between curved portions 1011*e* and 1021*e*. The embodiment of FIG. 10E enables a metallic article to provide CTE strain relief in both X and Y directions, while also providing perpendicular joints at nodes 1030*e*.

Figure 11:
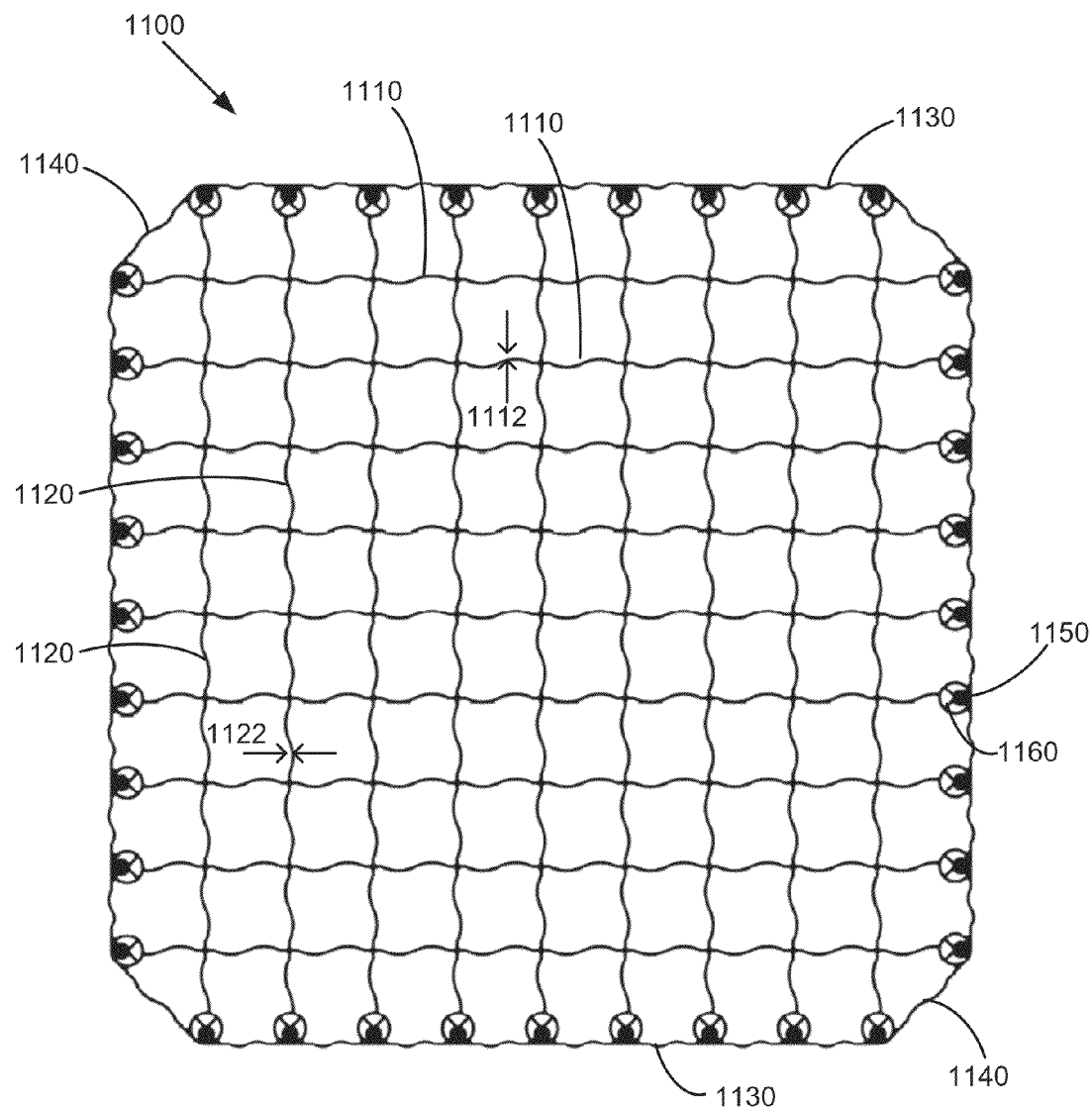
FIG. 11 shows a top view of a metallic article for the back side of a photovoltaic cell, with embodiments of adaptable features.

FIG. 11 is a top view of an exemplary metallic article 1100 for a back side of a solar cell. In this embodiment, metallic article 1100 has grid lines 1110 and 1120 intersecting approximately perpendicularly to each other and evenly spaced. In other embodiments, the grid lines 1110 and 1120 may intersect at non-perpendicular angles, and may have varying pitches. The grid lines 1110 and 1120 are configured with expansion segments along their entire length, although in other embodiments the grid lines 1110 and 1120 may be linear along a portion or all of their length. The metallic article 1100 is symmetrical, horizontally and vertically, allowing a photovoltaic cell to be rotated in any orientation for connection to a neighboring cell. In FIG. 11, the grid lines 1110 and 1120 have widths 1112 and 1122, respectively, that are wider than on the front side of a cell. For example, the widths 1112 and 1122 may be 0.5-2 mm compared to front side grid line widths of 50 to 300 μm. Thus, the metallic article 1100 can provide 2-5 times more copper than the front side mesh, and has very low resistance with minimal voltage drop. The metallic article 1100 can also be made thinner, such as half the thickness, of standard cells.

Metallic article 1100 may also have a larger edge border to serve as a soldering platform. The edge members 1130 and corner members 1140 that form the perimeter of metallic article 1100 may have widths that are the same or different than grid lines 1110 and 1120. In the embodiment of FIG. 11, solder pads 1150 are configured at the nodes where grid lines 1110 and 1120 meet the perimeter (e.g., edge members 1130 and corner members 1140) of the metallic article 1100. Solder pads 1150 provide a larger surface area than grid lines 1110 and 1120 for aligning with solder zones on the surface of a solar cell. Solder pads 1150 in this embodiment also include radial struts 1160, such as to provide for strain relief at the nodes and for additional area for bonding.

Figure 12:
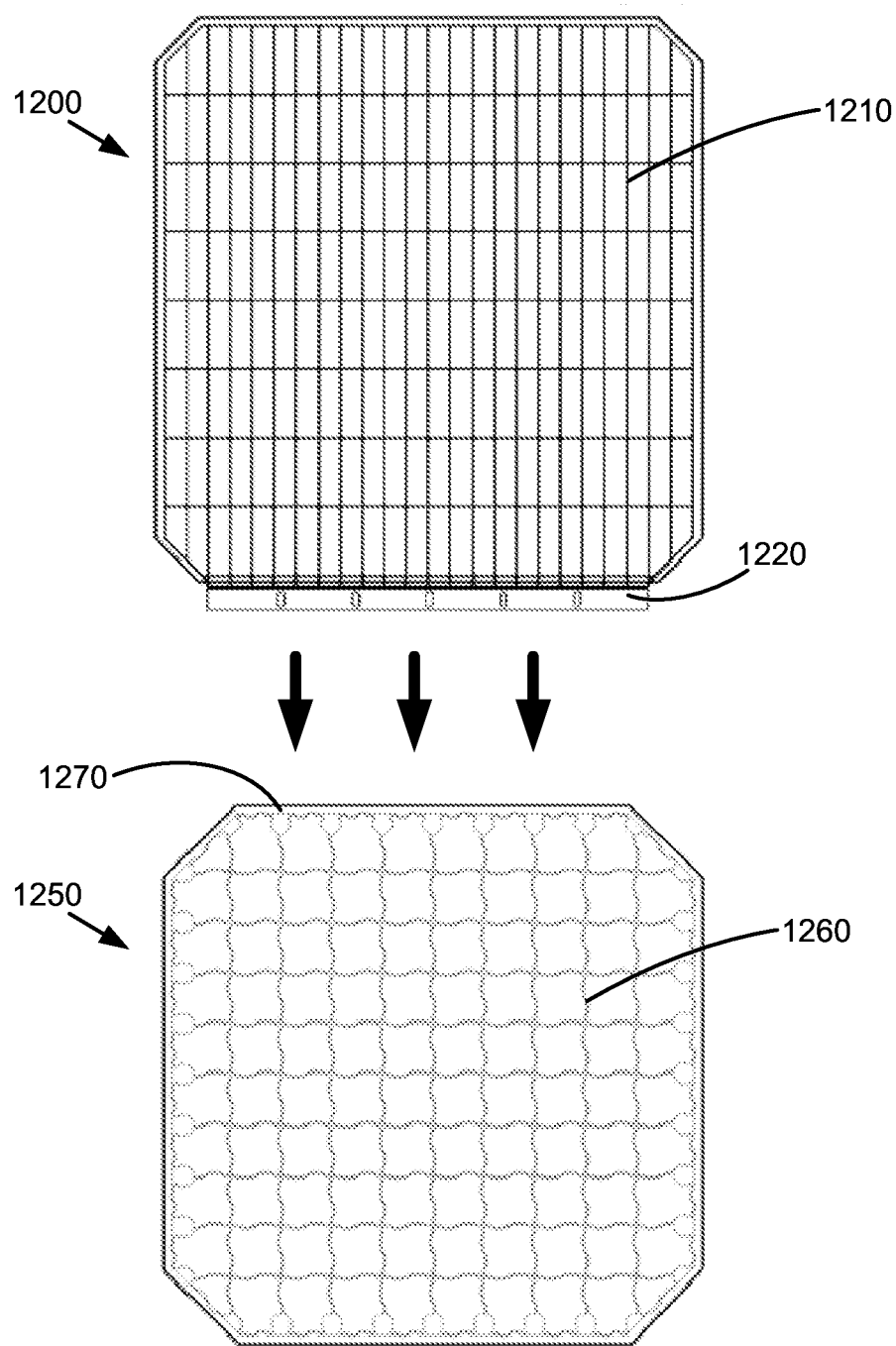
FIG. 12 illustrates a cell-to-cell interconnection between an exemplary front mesh and back mesh.

FIG. 12 shows an exemplary front-to-back cell-to-cell interconnection between two photovoltaic cells, using metallic articles of the present disclosure. Cell 1200 has a metallic article 1210 mounted on the front side, where the metallic article 1210 includes an interconnect element 1220 at one edge. Metallic article 1210 may be, for example, the metallic grids of FIG. 4 or FIG. 8. Interconnect 1220 is joined to the back side of cell 1250, which has a metallic article 1260 configured as a back side mesh similar to FIG. 11. The joining may be achieved by, for example, soldering, welding, ultrasonic, conductive adhesive, or other electrical bonding methods. The interconnect 1220 is bonded to the bus bar 1270 of metallic article 1260 for a series connection of cells 1200 and 1250.

Figure 13:
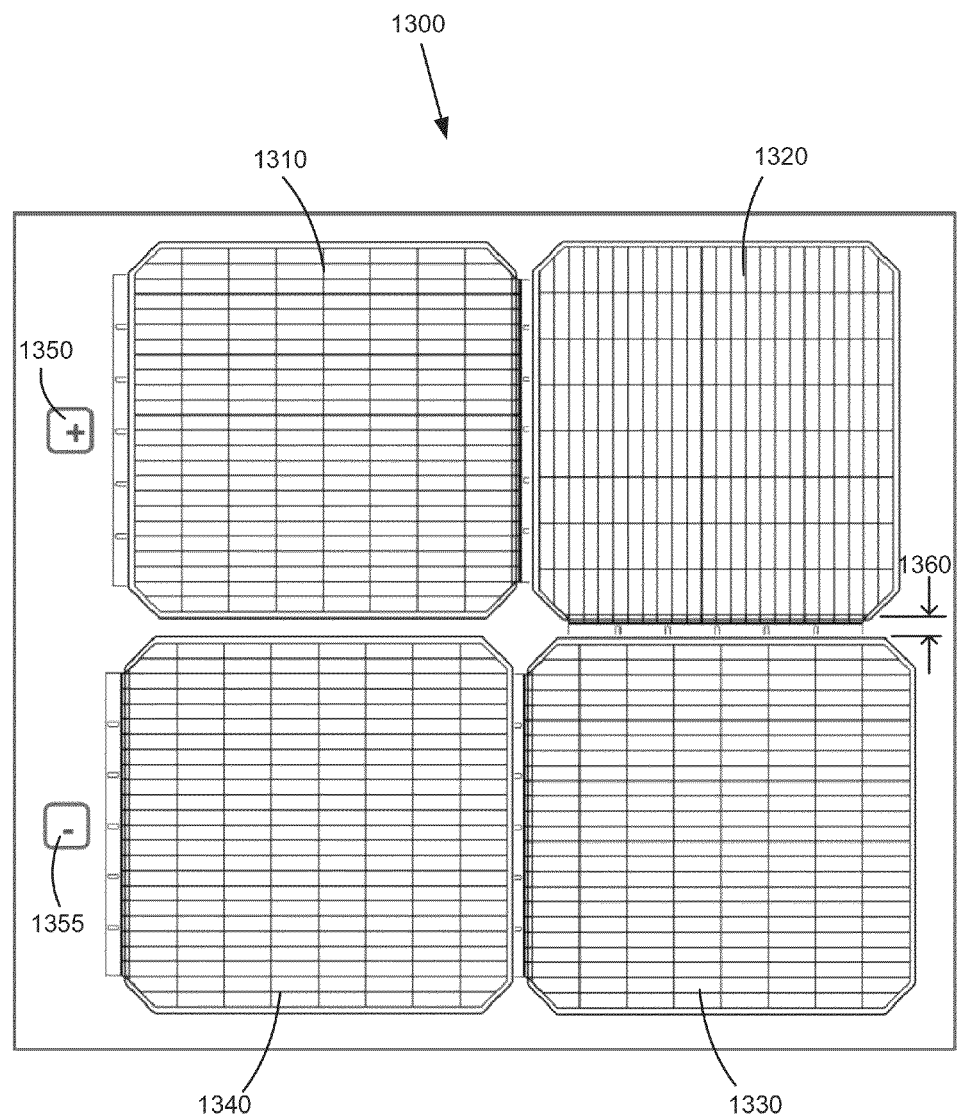
FIG. 13 shows exemplary photovoltaic cells with metallic articles, forming a module assembly.

FIG. 13 illustrates an assembly 1300 of photovoltaic cells 1310, 1320, 1330 and 1340 in one embodiment, as would be assembled for a module. Four cells are shown in FIG. 13, although any number of cells—such as 36-60—may be utilized in a module as desired. Each neighboring pair of cells is joined together as described in relation to FIG. 12. However, in the embodiment of FIG. 13 each adjacent cell is rotated 90° from the previous cell. For example, cell 1320 is rotated 90° clockwise from cell 1310 to connect to cell 1330, and cell 1330 is rotated 90° clockwise from cell 1320 to connect to cell 1340. Cell 1310 in FIG. 13 provides a positive terminal 1350 for the module 1300, while cell 1340 provides the negative terminal 1355. Thus, the mesh designs that have been disclosed within can be designed with a symmetry that allows for various orientations on a cell, enabling cells within a module to be connected in any sequence as desired. The cells 1310, 1320, 1330 and 1340 are assembled with a gap 1360 between them—similar to gaps 651 and 652 of FIG. 6. The gap 1360 allows for flexure of the overall module, and also assists with the flow of laminating material when encapsulating the finished module.

Figure 14:
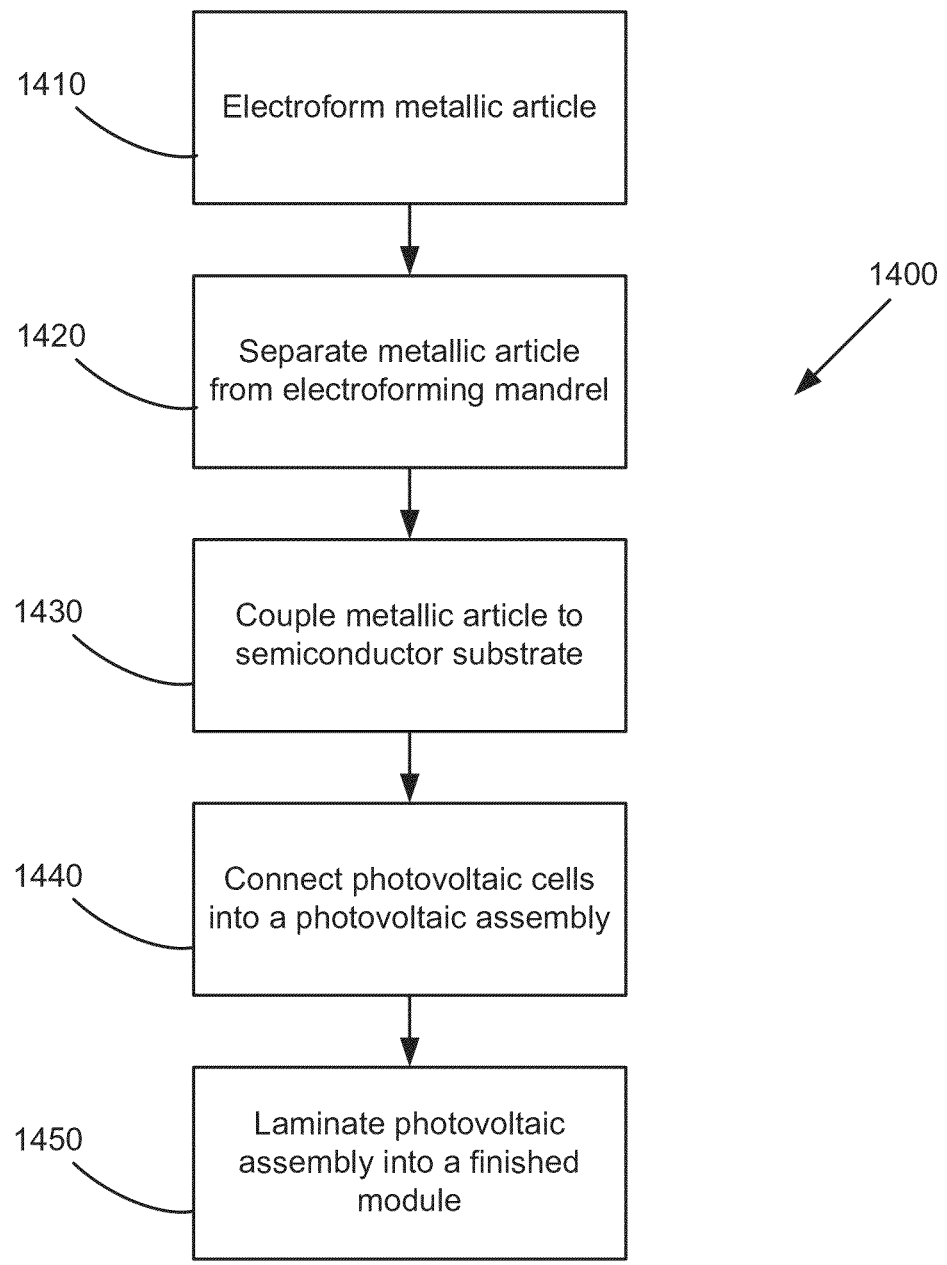
FIG. 14 is a flow chart of an exemplary method for forming photovoltaic modules using metallic articles of the present disclosure.

FIG. 14 is an exemplary flow chart 1400 of a method for manufacturing a solar cell module using metallic articles as described above. In step 1410, a metallic article is electroformed using an electrically conductive mandrel. The mandrel has one or more preformed patterns in which to form the metallic article. In some embodiments, the metallic article is configured to serve as an electrical conduit within a photovoltaic cell. In certain embodiments, the metallic article may include integral features to enable connections between photovoltaic cells of a solar module. In other embodiments, interconnection features may be fabricated separately and joined to the metallic article. If formed separately, the interconnection features may be formed by, for example, electroforming or stamping of sheet material. At least a portion of the finished electroformed metallic article is created within the preformed patterns. The metallic article has a plurality of electroformed elements with customized features that may include one or more of: a) a non-uniform width along a first length of a first element, b) a change in conduit direction along the first length of the first element, c) an expansion segment along the first length of the first element, d) a first width that is different from a second width of a second element in the plurality of electroformed elements, e) a first height that is different from a second height of the second element in the plurality of electroformed elements, and f) a top surface that is textured. The metallic article may be configured to function as electrical grid lines, bus bars, cell-to-cell interconnects, and solder pads for a photovoltaic cell.

Step 1410 may include contacting the outer surface of the electroforming mandrel with a solution comprising a salt of a first metal, where the first metal may be, for example copper or nickel. The first metal may form the entire metallic article, or may form a metallic precursor for layers of other metals. For example, a solution of a salt comprising a second metal may be plated over the first metal. In some embodiments, the first metal may be nickel and the second metal may be copper, where the nickel provides a barrier for copper diffusion. A third metal may optionally be plated over the second metal, such as the third metal being nickel over a second metal of copper, which has been plated over a first metal of nickel. In this three-layer structure, the copper conduit is encapsulated by nickel to provide a barrier against copper contamination into a semiconductor device. Electroforming process parameters in step 1410 may be, for example, currents ranging from 1 to 3000 amps per square foot (ASF) and plating times ranging from, for example, 1 minute to 200 minutes. Other electrically conductive metals may be applied to promote adhesion, promote wettability, serve as a diffusion barrier, or to improve electrical contact, such as tin, tin alloys, indium, indium alloys, bismuth alloys, nickel tungstate, or cobalt nickel tungstate.

After the metallic article is formed, the metallic article is separated in step 1420 from the electrically conductive mandrel to become a free-standing, unitary piece. The separation may involve lifting or peeling the article from the mandrel, such as manually or with the assistance of tools such as vacuum handling. Peeling may also be facilitated by using the interconnect element—such as element 600 of FIG. 6—as a handle for initiating and lifting the metallic article. In other embodiments, removal may include thermal or mechanical shock or ultrasonic energy to assist in releasing the fabricated part from the mandrel. The free-standing metallic article is then ready to be formed into a photovoltaic cell or other semiconductor device, by attaching and electrically coupling the article as shall be described below. Transferring of the metallic article to the various manufacturing steps may be done without need for a supporting element.

In step 1430 the metallic article is coupled to a semiconductor substrate, mechanically and electrically. Step 1430 may include coupling a front grid to the front side of a semiconductor wafer, and coupling a back grid to the back side of the wafer. The coupling may be soldering, such as manual or automated soldering. The solder may be applied at specific points such as silver solder pads that have been printed onto the wafer. In some embodiments, the solder may have been pre-applied onto all or some of the metallic article, such as by plating or dipping. Pre-applied solder may then be reflowed during the coupling process of step 1430. In other embodiments, the solder may be an active solder, and may enable bonding at non-metallized portions of the wafer as described in U.S. Provisional Patent Application, 61/868,436, entitled "Using an Active Solder to Couple a Metallic Article to a Photovoltaic Cell," filed on Aug. 21, 2013, owned by the assignee of the present application and incorporated by reference herein.

Joining the metallic article to the semiconductor in step 1430 may utilize, for example, ultrasonic, infrared, hot bar, or rapid thermal processing techniques. The bonding may be performed on one joint at a time, or a region of the wafer, or the entire wafer at once. The metallic article may include expansion segments to reduce bowing or breakage that may occur from the thermal stresses induced during bonding processes.

The semiconductor wafer may undergo additional processing steps before or after step 1430, such as to apply anti-reflection coatings. The specific coatings will be dependent on the type of cell being produced, and may include, for example, dielectric anti-reflective coatings such as nitrides, or transparent conductive oxides such as indium-tin-oxide.

The prepared photovoltaic cells are then connected together in step 1440. The interconnections may be performed as described in relation to FIGS. 12 and 13, for a front-to-back series connection. In other embodiments, the cells may be wired in parallel with front-to-front and back-to-back connections.

In step 1450, a module assembly is laminated together. In some embodiments, the assembly may include a backing sheet such as a polyvinyl fluoride (PVF) film, with a laminating material (e.g., EVA) placed onto the backing sheet. The photovoltaic cells are placed on the EVA sheet, and another EVA sheet on top of the cells. Finally, a glass sheet is over the top EVA sheet. The entire layered stack is put in a laminator, where heat and vacuum are applied to laminate the assembly. To complete the module, the electrical connections of the cells are wired to a junction box.

It can be seen that the free-standing electroformed metallic article described herein is applicable to various cell types and may be inserted at different points within the manufacturing sequence of a solar cell. Furthermore, the electroformed electrical conduits may be utilized on either the front surface or rear surface of a solar cell, or both. In addition, although the embodiments herein have primarily been described with respect to photovoltaic applications, the methods and devices may also be applied to other semiconductor applications such as redistribution layers (RDL's) or flex circuits. Furthermore, the flow chart steps may be performed in alternate sequences, and may include additional steps not shown. Although the descriptions have described for full size cells, they may also be applicable to half-size or quarter-size cells. For example, the metallic article design may have a layout to accommodate the cell having only one or two chamfered corners instead of all four corners being chamfered as in a mono-crystalline full pseudosquare.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method of forming an electrical component for a photovoltaic cell, the method comprising:
   electroforming a metallic article on an electrically conductive mandrel, wherein the electrically conductive mandrel has an outer surface comprising at least one preformed pattern, wherein the metallic article comprises a plurality of electroformed elements formed by the preformed pattern; and
   separating the metallic article from the electrically conductive mandrel, wherein the plurality of electroformed elements are interconnected such that the metallic article forms a unitary, free-standing piece when separated from the electrically conductive mandrel;
   wherein the plurality of electroformed elements are configured to serve as an electrical conduit for a light-incident surface of the photovoltaic cell;
   wherein the plurality of electroformed elements comprises a first element configured with a first expansion segment along at least a portion of a first length of the first element, the first expansion segment having dimensions chosen to accommodate a difference in coefficient of thermal expansion between the metallic article and a semiconductor substrate of the photovoltaic cell, wherein the first expansion segment is configured as a wave pattern; and
   wherein the first element further comprises a plurality of bonding areas, the first expansion segment being between the bonding areas.

2. The method of claim 1 wherein the first element has a non-uniform width along the first length of the first element.

3. The method of claim 2 wherein the non-uniform width is a tapered width along the first length.

4. The method of claim 3 wherein the tapered width increases toward a current collection end of the photovoltaic cell.

5. The method of claim 1 wherein the first element has the change in conduit direction along the first length of the first element.

6. The method of claim 5 wherein the first element is a bus bar, and the change in conduit direction is a bend that is configured to be located near a corner of a pseudosquare photovoltaic cell.

7. The method of claim 1 wherein the first expansion segment has a geometry that is oriented in a plane parallel to the photovoltaic cell.

8. The method of claim 1 wherein the wave pattern comprises a wavelength of 1-10 mm and an amplitude of 200-300 µm to accommodate the difference in coefficient of thermal expansion between the metallic article and the semiconductor substrate of the photovoltaic cell.

9. The method of claim 1 wherein the first element has a first width that is different from a second width of a second element in the plurality of electroformed elements.

10. The method of claim 1 wherein the first element is a bus bar, and the bus bar is positioned near a perimeter of the metallic article.

11. The method of claim 1 wherein the plurality of electroformed elements further comprises a cell-to-cell interconnect at an edge of the metallic article, and the cell-to-cell interconnect comprises an aperture through its thickness.

12. The method of claim 11 wherein the aperture is a plurality of holes or slits.

13. The method of claim 11 wherein the thickness of the cell-to-cell interconnect comprises a height that is different from a first height of the first element in the plurality of electroformed elements.

14. The method of claim 1, wherein the first element has a top surface that is textured.

15. The method of claim 14 wherein the texturing comprises an intentional roughness.

16. A method of forming an electrical component for a photovoltaic cell, the method comprising the steps of:
   electroforming a metallic article on an electrically conductive mandrel, wherein the electrically conductive mandrel has an outer surface comprising at least one preformed pattern, wherein the metallic article comprises a plurality of electroformed elements formed by the preformed pattern; and
   separating the metallic article from the electrically conductive mandrel, wherein the plurality of electroformed elements are interconnected such that the metallic article forms a unitary, free-standing piece when separated from the electrically conductive mandrel;
   wherein the plurality of electroformed elements are configured to serve as an electrical conduit for a light-incident surface of a photovoltaic cell;
   wherein a first element in the plurality of electroformed elements is a cell-to-cell interconnect having a first height; and
   wherein a second element in the plurality of electroformed elements is a grid line for a surface of the photovoltaic cell, the second element having a second height and a lengthwise profile, the lengthwise profile comprising an expansion segment along at least a portion of a second length of the second element, wherein the expansion segment is configured to accommodate a difference in coefficient of thermal expansion between the metallic article and a semiconductor substrate of the photovoltaic cell, and wherein the first height is less than the second height.

17. The method of claim 16 wherein:
   the first element has a first width;
   the second element has a second width; and
   the first width is greater than the second width.

18. The method of claim 16 wherein the first height of the first element comprises a thickness of the first element, and wherein the first element comprises an aperture through its thickness.

19. The method of claim 16 wherein the lengthwise profile comprises a tapered width along the second element.

20. The method of claim 16 wherein the second expansion segment is configured as a wave pattern.

21. The method of claim 16 wherein the lengthwise profile comprises a change in conduit direction along the second length of the second element.

22. The method of claim 1 wherein the plurality of electroformed elements further comprises a second element configured with an expansion segment along at least a portion of a second length of the second element, and wherein the first and second expansion segments allow for two-dimensional stress relief.

23. The method of claim 22 wherein the first and second elements are configured as intersecting grid lines.

24. The method of claim 22 wherein the first expansion segment has a different amplitude and period than the second expansion segment.

25. The method of claim 1 wherein the plurality of electroformed elements further comprises edge members forming a perimeter of the metallic article.

26. The method of claim 25 wherein the plurality of electroformed elements further comprises a solder pad at a node where the first element meets the perimeter, and wherein the solder pad has a larger surface area than the first element at the node.

27. The method of claim 1 wherein the bonding area has a bonding area width that is greater than a first width of the first element.

28. The method of claim 16 wherein the plurality of electroformed elements further comprises a third element configured with an expansion segment along at least a portion of a third length of the third element, and wherein the expansion segments of the second and third elements allow for two-dimensional stress relief.

29. The method of claim 16 wherein the second element further comprises a plurality of bonding areas, with the expansion segment being between the bonding areas.

* * * * *